United States Patent [19]

Christmann et al.

[11] 4,081,764
[45] Mar. 28, 1978

[54] ZINC OXIDE LIGHT EMITTING DIODE

[75] Inventors: Marvin H. Christmann, Afton Township, Washington County, Minn.; Richard L. Weiher, Hudson Township, St. Croix County, Wis.; William C. Tait, Oak Park Heights, Minn.

[73] Assignee: Minnesota Mining and Manufacturing Company, St. Paul, Minn.

[21] Appl. No.: 396,003

[22] Filed: Sep. 10, 1973

Related U.S. Application Data

[63] Continuation-in-part of Ser. No. 296,837, Oct. 12, 1972, abandoned.

[51] Int. Cl.² .......................................... H01L 33/00
[52] U.S. Cl. ............................... 331/94.5 H; 313/499;
357/10; 357/15; 357/17; 357/18; 357/60
[58] Field of Search .................. 331/94.5 H; 313/499;
357/10, 15, 17, 18

[56] References Cited

U.S. PATENT DOCUMENTS

| | | | |
|---|---|---|---|
| 3,255,393 | 6/1966 | Hutchins et al. | 317/235 UA |
| 3,505,613 | 4/1970 | Campbell et al. | 331/94.5 |
| 3,541,375 | 11/1970 | Aven | 317/235 UA |
| 3,689,863 | 9/1972 | Matsuoka et al. | 317/235 UA |

OTHER PUBLICATIONS

Fisher et al., "Tunnel-Injection Electroluminescence", J. Appl. Phys., vol. 34, No. 7, July 1963, pp. 2112-2113.
Jaklevic et al., "Injection Electroluminescence", Appl. Phys. Lett., vol. 2, No. 1, Jan. 1, 1963, pp. 7-9.
Neville et al., "Surface Barriers on ZnO", J. Appl. Phys., vol. 41, No. 9, Aug. 1970, pp. 3795-3800.
Nill et al., "Laser Emission from Metal Semiconductor Barriers", Appl. Phys. Lett., vol. 16, No. 10, May 15, 1970.

*Primary Examiner*—William D. Larkins
*Attorney, Agent, or Firm*—Cruzan Alexander; Donald M. Sell; William B. Barte

[57] ABSTRACT

A light emitting diode comprising a single crystal of high efficiency violet fluorescing zinc oxide together with an ohmic cathode and a rectifying anode secured thereto. The diode emits near band-gap radiation at room temperature when energized with low D.C. voltage. The produced light is believed to be associated with radiative recombination of free excitons.

18 Claims, 4 Drawing Figures

ZINC OXIDE LIGHT EMITTING DIODE

CROSS REFERENCE TO RELATED APPLICATIONS

This application is a continuation-in-part of U.S. Patent Application Ser. No. 296,837, filed Oct. 12, 1972, now abandoned, and is related to U.S. Patent Application Ser. No. 291,023, filed Sept. 21, 1972, now abandoned, by one of the present inventors, Richard L. Weiher, together with Kjell I. Hagemark and Gerhard W. Voll.

BACKGROUND OF THE INVENTION

1. Field of the Invention

The present invention relates to light emitting diodes (LED's) and is particularly directed to LED's which are operable at room temperature and which efficiently emit light upon excitation with low voltages.

2. Description of the Prior Art

LED's convert electrical energy into light energy by means of a radiative recombination of carriers (electrons and holes) across a rectifying junction in a semiconductor. Early LED's included III-V compound semiconductors in which light emission is produced as a result of a radiative recombination of carriers at a p-n junction. A basic limitation of these early LED's is that the energy band-gap of most III-V compound semiconductors is such that the resultant light emission is in the infrared wavelength region. Inefficient up-converters must then be used to convert the infrared into visible light.

II-VI compounds are known to exhibit efficient direct wide-band-gap transitions, and have therefore been extensively investigated for use in diodes which will emit shorter wavelength light. Unfortunately, the same wide band-gap which makes them desirable for such applications also mitigates against the production of p-n junctions in all but a few such compounds. The difficulty in forming a p-n junction has caused II-VI compound LED research to be directed to the treatment of II-VI compounds for enabling a direct band-gap radiative recombination in the II-VI compounds by non p-n junction techniques. An exemplary survey of non p-n junction radiative recombination mechanisms in II-VI compounds is set forth in an article by A. G. Fischer, *Electroluminescence in II-VI Compounds,* 541–599, at pages 572–578; contained within the book, "Luminescence of Inorganic Solids", P. G. Goldberg, editor, New York Academic Press, 1966, New York, New York.

In spite of such limitations, some degree of success in forming II-VI compound LED's is evidenced by U.S. Pat. No. 3,541,375 and U.S. Patent application Ser. No. 851,906, filed Aug. 21, 1969. Both references disclose that the II-VI compounds must be doped with extrinsic luminescent centers, since intrinsic radiative recombinations having an energy nearly equal to the band-gap were believed unlikely. Such LED's produce radiation having an energy characteristic of the luminescent center and are incapable of producing near band-gap emission having an energy nearly equal to that of the band-gap of the II-VI material.

SUMMARY OF THE INVENTION

We have invented what we believe is the first LED which efficiently emits violet and near ultraviolet light at room temperature when a low electrical potential is applied. The LED of this invention is characterized by a single, high efficiency violet fluorescing zinc oxide (a II-VI compound) crystal having a substantially ohmic cathode contact secured to one portion of the crystal and a rectifying anode contact secured to another portion of the crystal. In this LED near UV photons are produced as a result of direct band-gap radiative recombinations.

The characteristics of the zinc oxide crystals are of paramount importance to this invention. Crystals useful in the present invention are described in the cross-referenced copending U.S. Patent application Ser. No. 291,023 filed Sept. 21, 1972, the entire disclosure of which is incorporated herein by reference.

We have discovered that with these high external fluorescent efficiency crystals having a uniform low resistivity throughout, efficient near UV emission having an energy nearly equal to the band-gap of zinc oxide can be produced as the result of radiative recombinations of electrons and holes. We believe the recombinations are associated with a radiative decay of free excitons, and are not associated with an introduction of extrinsic luminescent centers such as are described in the prior art cited hereinabove. The room temperature (300° K) emission from the LED's of the present invention is centered at about 4000A, i.e., 3.1 eV, which suggests band-gap transitions resulting from the decay of excitons, since this is nearly equal to the band-gap of zinc oxide. This is further confirmed by the low temperature emission (77° K) spectra, which shows a series of intensity peaks believed to be associated with the radiative decay of free excitons together with the simultaneous production of one or more longitudinal optical phonons.

We have further discovered that it is unnecessary to dope the pure, high efficiency violet fluorescing zinc oxide crystals to enhance the injection of minority carriers (i.e., holes). We have found that direct contact of a rectifying anode to such a ZnO crystal allows a sufficient number of holes to be injected into such a crystal to enable the efficient production of light having an energy close to the band-gap of zinc oxide.

The mechanism whereby such efficient hole injection is accomplished without treating the crystal is not clear. It has been observed that efficient production of light may result upon application of a forward bias voltage having a potential less than the band-gap of the semiconductor. Hence quantum tunnelling does not appear to be the sole means for hole injection.

A suitable rectifying anode may comprise a high work function material. In one embodiment, a small area anode containing a number of point contacts is preferred. Such point contacts are formed of gold particles in a silicate binder when applied as a conductive paint to the crystal surface.

Figure 1:
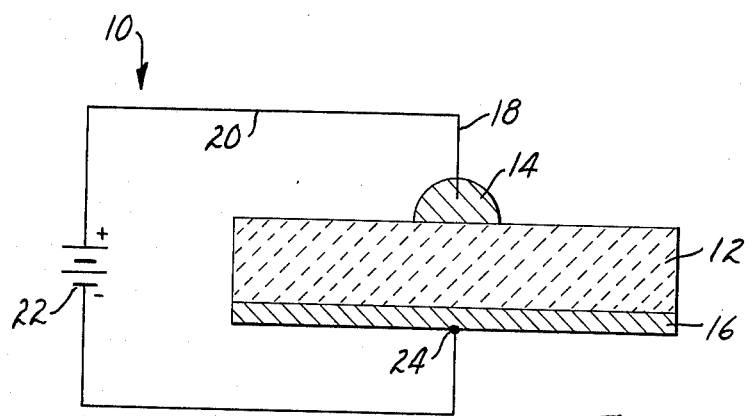
FIG. 1 illustrates a combined schematic and cross-sectional view of one embodiment of a LED according to the present invention.
Figure 3:
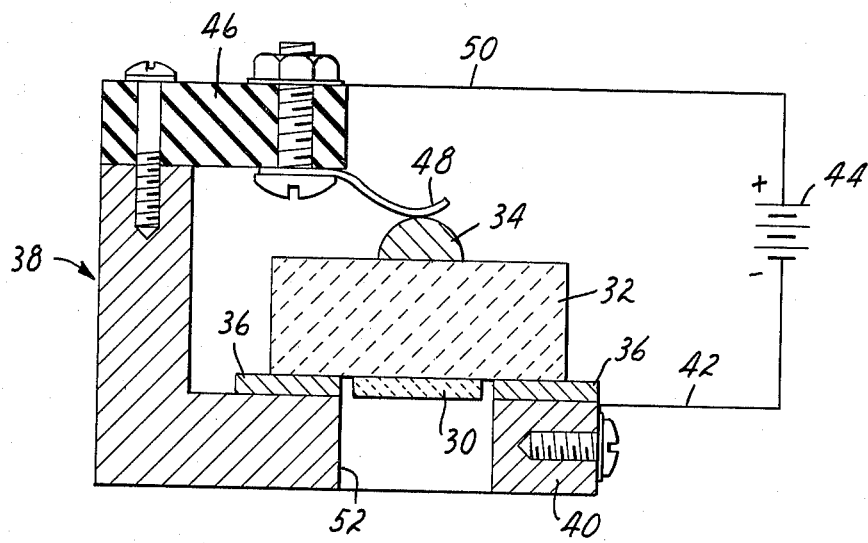
FIG. 3 illustrates a combined schematic and cross sectional view of another embodiment of the present invention in which a fluorescing layer is secured to the crystal.
Figure 4:
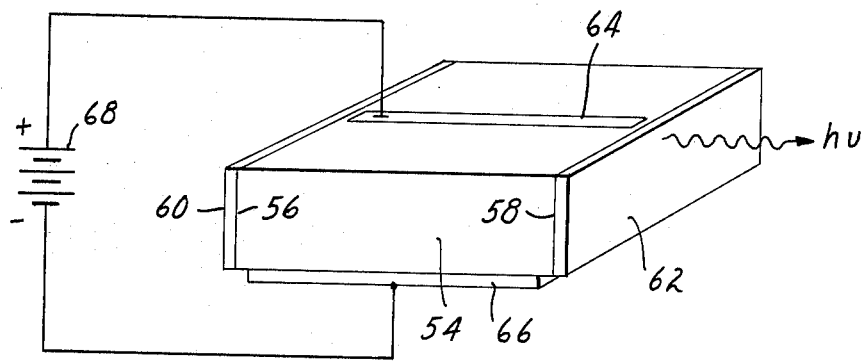
FIG. 4 illustrates a combined schematic and three dimensional view of a further embodiment of the present invention in which two opposite optically parallel faces of the crystal form a resonant cavity for producing coherent emission.

The relative dimensions of the LED structures indicated in the FIGS. 1, 3 and 4 are distorted to facilitate clear portrayal.

DESCRIPTION OF THE PREFERRED EMBODIMENTS

FIG. 1 includes a cross-sectional view of an illustrative diode 10 according to the present invention. A high work function material, such as the metals copper, silver, gold and platinum or a non-metal such as carbon, is attached to a portion of a pure single crystal of zinc oxide 12 to provide a small area rectifying anode 14 containing a plurality of point contacts. A low work function material, e.g., a metal such as indium, zinc or transparent semiconductor such as tin oxide or indium oxide, or mixtures of such oxides is attached to another portion of the crystal 12 to provide an ohmic cathode 16. It is preferred that the work function of the cathode be less than that of zinc oxide. A gold wire 18 is embedded in the anode 14. Lead 20 completes the connection between the wire 18 and a DC source 22. Lead 24 may be soldered directly to the cathode 16 and connected to the source 22. When a low DC voltage, in excess of about 1.8 volts, is applied from the voltage source 22 in the forward direction (i.e., with the anode positive) to diodes having anodes such as disclosed in the examples set forth hereinafter, violet light is emitted from the area adjacent the anode 14 at a current density of 10–20 amperes/$cm^2$. Similar results are obtained with a low AC voltage.

Figure 2:
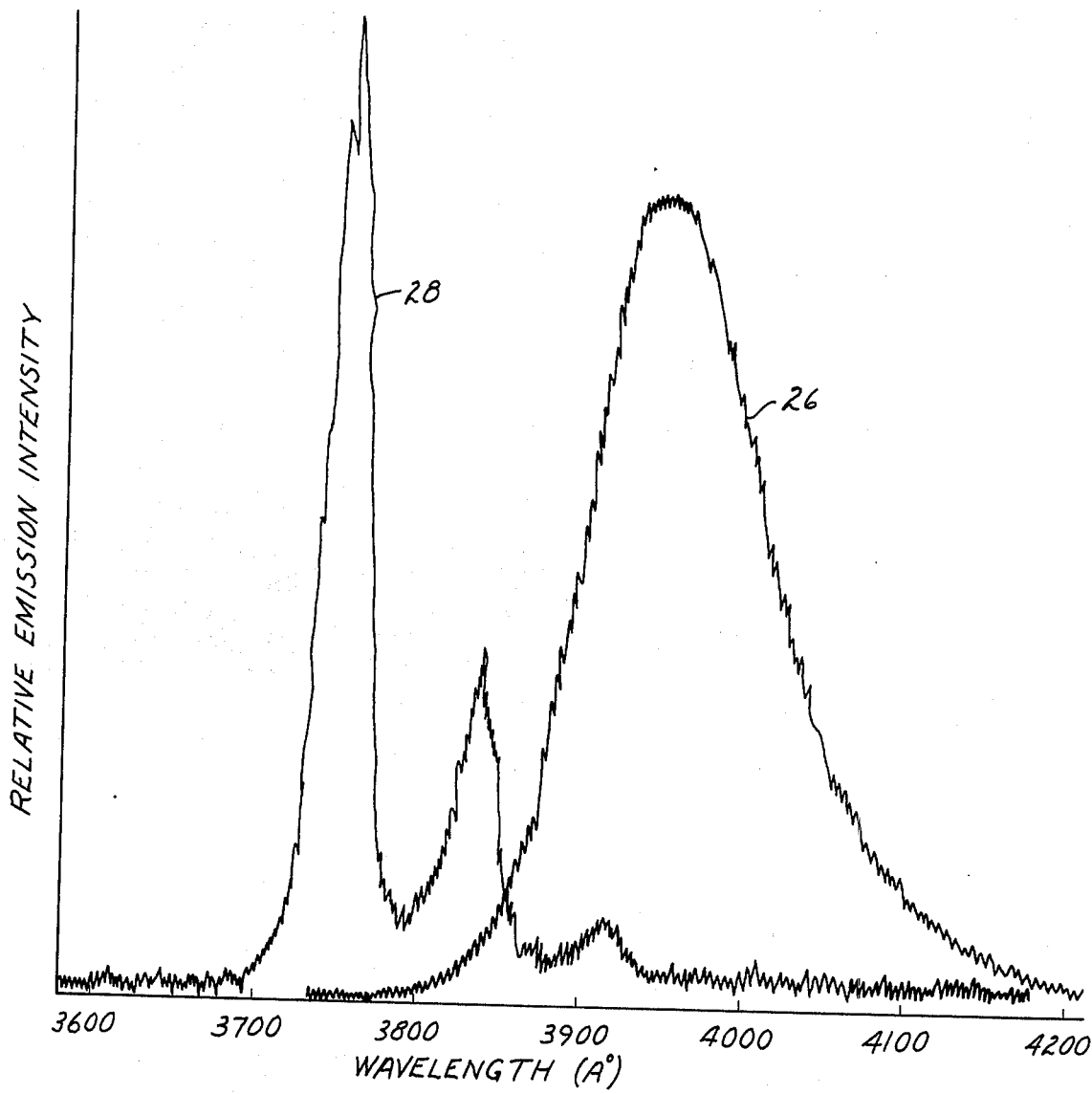
FIG. 2 illustrates the emission spectra produced from an LED according to the present invention, taken at 77° K and 300° K.

FIG. 2 is illustrative of the spectral characteristics of the emitted light. A broad band ZnO emission spectrum 26, having a peak intensity centered at about 4000A, is observed at room temperature. When the diode is operated at cryogenic temperatures (e.g., about 77° K) at which the band-gap of the zinc oxide is shifted to about 3.4 eV, the ZnO emission spectrum 28 is seen to shift to a shorter wavelength and to break into a series of peaks. These peaks in the spectrum 28 are separated from each other by an energy associated with that of one longitudinal optical phonon, with the highest energy peak being at an energy associated with the annihilation of the lowest lying free exciton and the emission of one longitudinal optical phonon, thus giving rise to the belief that the emission is due to the radiative recombination of free excitons (electron-hole pairs) and the simultaneous emission of one or more longitudinal optical phonons. These spectra are identical to UV excited fluorescence spectra.

FIG. 3 is illustrative of an embodiment of the present invention in which a UV sensitive fluorescent layer 30 is secured to the crystal 32. In one example, a dot of gold paint 34, such as is described in Example 3 hereinafter, is applied to the crystal 32 while indium foil 36 is secured to another face to complete the basic LED structure. Electrical contacts are made by positioning the LED within a jig 38 having a conductive base 40 onto which the indium foil 36 readily forms an ohmic contact. An electrical lead 42 is conveniently secured thereto for completing a connection to the negative terminal of a DC source 44. An insulative support member 46 is secured to the base 40. A gold wire 48 is secured to the support member 46 and spring loaded against the gold dot 34. A lead 50 is electrically connected to the wire 48 in order to complete the connection to the source 44. An aperture 52 is provided in the base 40, through which light may be emitted upon energization of the LED. In this embodiment, the wavelength of the emitted light is dictated by the fluorescence characteristics of the layer 30, which fluorescence is stimulated by the violet and near UV light produced in the crystal 32.

In another embodiment, the LED of the present invention may be fabricated to form a resonant cavity such that coherent radiation may be produced therefrom. In such a case, a zinc oxide crystal is preferably cleaved to produce opposing optically parallel faces which are then reflectorized to form the resonant cavity. FIG. 4 shows such an embodiment, in which a zinc oxide crystal 54 cut and chemically polished according to the manner set forth in Example 1 is cleaved to produce opposing optically parallel faces 56 and 58. Reflectorized layers 60 and 62 are secured to the cleaved faces 56 and 58 to complete the resonant structure. A thin strip gold rectifying anode 64 is applied on one face, extending between the reflectorized faces, and an ohmic cathode 66 is applied to the surface opposite the anode 64. Upon suitable excitation from the source of DC potential 68, under conditions in which the concentration of excitons reaches at least a predetermined concentration, coherent emission through one of the reflectorized layers 60 or 62 may be produced.

The zinc oxide crystals used in the present invention may be in the form of thin slabs sliced from a single crystal or may be used as naturally grown.

The crystals are selected for use in our LED's upon observing the fluorescence emanating therefrom upon exposure to ultraviolet radiation from a laser, mercury arc or similar UV source while at a temperature of about 77° K. Such observations are made by using a calibrated spectrophotometer, such as a Perkin-Elmer, Inc. Model 350. If the crystal fluoresces in the 3700–4000A band at an external fluorescent efficiency in excess of about 0.001, it is suitable for use in the LED.

Routine examination of a quantity of crystals is facilitated by comparing the fluorescence with that produced by a "standard" material earlier determined to have a high external fluorescent efficiency of 0.01–0.02. Crystals exhibiting near UV fluorescence as low as 10% of the "standard" are still useful in our light emitting diode. Determination of the efficiency of the "standard" material is conveniently accomplished by using a calibrated UV source together with the spectrophotometer according to established photometric techniques. One such technique is fully set forth in the above-referenced copending patent application Ser. No. 291,023, filed Sept. 21, 1972. The external fluorescent efficiency, is an expression of the ease with which radiative transitions occur within the crystal. External fluorescent efficiency is herein defined as the ratio of the measured fluorescent energy to the measured excitation energy.

Comparative determination of diode and external fluorescent efficiencies may be made, wherein an LED is positioned such that a UV source can be focused onto a smooth surface of the crystal adjacent the anode to uniformly excite an area on that surface substantially equal to the area of the anode and such that the same solid angles between the anode and the spectrophotometer and the UV excited area and the spectrophotometer are maintained. For example, an LED fabricated in the manner set forth in Example 2 hereinafter, after having been first treated to have an optically smooth surface on which a gold anode was applied, was excited by focusing near UV light (3250A) from a Spectra Physics Inc. Model 185 laser, onto the adjacent area to uniformly excite that area. A portion of the resultant fluorescent light was collected by a calibrated photodetector adjacent an opposite surface of the crystal. The external fluorescent efficiency of the crystal was determined to be about 0.02. Electrical energy was then applied to the anode and cathode and the emitted diode light was similarly measured by the photodetector. Under suitable excitation levels the diode was observed to have an internal efficiency of approximately 0.01. With an optimum optical geometry for collecting as much of the internally generated light as possible the external efficiency will similarly approach 0.01.

Most as-grown zinc oxide crystals exhibit primarily a green fluorescence in a band between 4500-6000A. Such crystals in that state are not useful in the present invention, and may be converted according to the method fully disclosed in detail in the copending patent application, Ser. No. 291,023, referred to hereinabove. In a preferred embodiment, the technique involves doping the zinc oxide crystal with excess zinc, followed by a polishing step to remove an outer layer thereby optimizing violet and near UV fluorescence from the interior of the crystal.

Generally, crystals or slabs of zinc oxide which meet the above fluorescence requirements have been found to have an electron concentration equal to about $10^{17}$ electrons per $cm^3$ at room temperature. This level of electron concentration serves to keep the room temperature resistivity of the crystal at about one ohm-cm. If the concentration of acceptor states, specifically those provided by Li and Na, can be reduced below $10^{16}$ per $cm^3$, it is believed that the conduction band electron concentration may similarly be reduced, without materially altering the operability of LED's using such crystals.

Slabs cut from large boules of zinc oxide may conveniently be cut parallel or perpendicular to the z-axis. Where x or y-cut slabs are used, the crystal slab may be oriented to have either face adjacent the anode. Where z-cut slabs are used for ease in etching, it is preferable to attach the anode to the oxygen face of the crystal. Determination of the zinc and oxygen faces is easily made in that the oxygen face develops a characteristic frosty appearance upon etching with phosphoric acid, whereas the zinc face is much more resistant to such treatment.

Diodes produced according to the teaching herein exhibit typical diode current-voltage relationships and are capable of utilizing current densities equal to $10^4$ amps per $cm^2$ without the light output saturating as a function of voltage, provided that a sufficiently low duty cycle is applied to prevent undue heating of the crystal. Since the emission consists of highly energetic photons, it can be efficiently converted into virtually any color by being coupled to phosphors excitable by the near UV light. In certain preferred embodiments, such conversion is effected by coating the zinc oxide crystal with a selected luminescent material which is sensitive to the near UV light.

In a further preferred embodiment the crystal surfaces are shaped to minimize the internal reflection losses and to focus the generated light into an area suitable for the intended use.

Specific embodiments of useful light emitting diodes are as follows:

EXAMPLE 1

A vapor phase grown ZnO crystal was immersed in ZnS powder in a covered crucible, heated at 1000° C for 35 minutes, and etched in dilute $H_3PO_4$ (4 pts. $H_2O$ - 1 Pt. 85% $H_3PO_4$). After this treatment, the crystal exhibited efficient violet light emission when excited with UV light in the manner previously described. The crystal was cut into slabs about 1 mm thick, which were fine ground with sapphire powder to a thickness of about 100 microns on a commercial polishing apparatus; and an acid etch 20% $H_3PO_4$ was applied to each surface to remove any destruction layer. Each slab was rechecked to assure that it exhibited efficient violet light emission under UV excitation. These slabs were placed on a clean glass surface and mounted in a vacuum system 2½ inches (64 mm) below a tungsten wire basket loaded with a clean 4 inch (102 mm) length of 0.008 inch (0.2 mm) diameter 100% gold wire. The vacuum system was sealed and evacuated to at least $10^{-5}$ Torr and the Au was evaporated onto the crystal face. The system was then brought to atmospheric pressure, opened and the glass plate containing the slabs removed. Indium (99.999% pure) was similarly evaporated on the opposite face of the slabs. However, in this case, the system was returned to atmospheric pressure by allowing nitrogen gas to fill the bell jar to prevent any oxidation of the evaporated indium in case the wafers were still warm. Wafers about 2 mm × 3 mm were then cleaved from the larger ZnO slabs. When pressure contacts were attached to the evaporated layers and a forward voltage (i.e., with gold positive) greater than 1.8 volts applied, near UV and violet light was emitted from the crystal below the gold anode. The spectral dependence of light output versus wavelength for the emitted light at 300° and 77° K was typically as shown in FIG. 2.

EXAMPLE 2

A large ZnO crystal, approximately 1 × 1 × 1 $cm^3$, was heated in ZnS powder at 1000° C for 30 minutes and then etched in $H_3PO_4$ as in Example 1. After this treatment, the crystal exhibited efficient violet emission when excited with UV in the manner set forth hereinabove. An anode material was formed of 300 mesh gold powder dispersed in a sodium silicate binder solution (i.e. Sauereisen thinning liquid #14, obtained from the Sauereisen Cements Co., Pittsburgh, Pennsylvania) to form a paste. Dots of the gold paste approximately 1 mm in diameter were placed on the oxygen face of the crystal and allowed to dry, thus forming rectifying anodes. The cathode was indium-foil pressed to the sides of the crystal. With approximately 2v DC applied via pressure contacts to the gold and indium layers, violet light was emitted from beneath the anode dots and could be observed through the zinc face.

EXAMPLE 3

A z-cut wafer of ZnO about one mm thick was heated in ZnS powder at 1000° C for 30 minutes and polished by etching in $H_3PO_4$ acid as described in Example 1. The wafer exhibited efficient violet emission when excited with UV. Fine, sharp needles of gold, made by dissolving gold powder in mercury and removing the mercury with acid, were mixed with Sauereisen liquid thinner #14 to form a paste. Dots of the paste were placed on the oxygen face of the wafer and allowed to dry, thus forming rectifying anodes. Green luminescent ZnS powder was mixed with Sauereisen liquid thinner #14 and painted onto the zinc face opposite the anode dots. The cathode was indium foil pressed to the sides of the wafer. Violet emission occurred under the anode dots which, in turn, excited the ZnS luminescent powder to emit green light, when 9-12 volts DC was applied via pressure contacts to the gold dots and indium foil.

EXAMPLE 4

A ZnO z-cut wafer 0.5 mm thick, having an area 1 cm × 1 cm was heat-treated in ZnS powder at 1240° C for 20 minutes. The crystal was then polished by etching in $H_3PO_4$ as described in Example 1, and thereafter exhibited efficient violet emission when excited with UV. The zinc face of the wafer was then fine ground and coated with a transparent conductive layer of tin oxide as follows: Tin chloride powder was placed in an expanded region of a Pyrex tube and the wafer was placed at the other end of the tube. The whole system was heated to approximately 400° C and a mixture of oxygen and nitrogen gas transported the tin chloride vapor down the tube where it deposited on the wafer and oxidized to tin oxide to provide an ohmic, transparent, conductive coating. Four gold paste dots, as described in Example 3, were placed on the oxygen face and allowed to dry. With 9 volts DC applied via pressure contacts to the appropriate layers across the crystal (dots being the anode and the tin oxide coating being the cathode), a bright violet emission was observed under the gold dots when viewed through the transparent tin oxide coating.

EXAMPLE 5

A z-cut ZnO wafer approximately 0.5 mm thick having an area 1 cm × 1 cm was heat-treated in ZnS powder at 1240° C for 20 minutes. The wafer was etched afterwards in $H_3PO_4$ as described in Example 1 until it exhibited efficient violet emission when excited with UV. The oxygen face was coated with a conventional organic blue phosphor which fluoresces in the visible under UV excitation by dissolving the phosphor in alcohol and placing a few drops of the solution on the face and allowing to dry. Over this coating were applied dots of gold paste, as described in Example 3. Indium-foil was clamped to the edge of the wafer as the cathode. With 9 volts DC applied via pressure contacts, a bright blue emission was observed from directly beneath the anode dots. When the zinc face was also coated with the same dye containing alcohol solution, even brighter blue emission was observed with 9 volts DC applied across the crystal.

It has been found that small area point contacts are highly desirable in order to obtain efficient minority injection such that a sufficient number of minority carriers (i.e., "holes" in the "n-type" ZnO crystal) are produced under practical high field and current density conditions to radiatively recombine with electrons to produce useful quantities of light. The presence of a large number of such contacts within each dot of gold paste, or evaporated section of gold, etc. is evident by the presence of a number of minute spots of light associated with each dot. Each spot has an average dimension on the order of 0.5 micrometers or less. It is thus believed that each spot of light emission results from a minute point contact of approximately the same size as the light spots, or less.

It is believed that the gold particles used in the anode contacts discussed in the examples set forth hereinabove form the efficient small area point contacts which inject minority carriers into the crystal. Preferably, gold needles mixed in a "Sauereisen" cement are used as the anode in forming such point contacts. When evaporated, gold films were used as the anode, it was necessary to cleave or otherwise mechanically deform the crystal wafer in order to form such efficient small area point contacts on the crystal.

To further explore the formation of point contacts, crystals of ZnO have been further treated with concentrated HCl, which crystals have then been coated with a thin (30-100A) film of silica ($SiO_x$, where $x = 1.7$) which is believed to contain a large number of discontinuities. Diodes were then formed from the silica coated crystals using a gold film anode. The characteristic emission of many spots of light was still observed.

Diodes formed from uncleaved or non-deformed HCl treated crystals but without the subsequent silica film applied thereto were not observed to produce any useful quantity of light emission.

In a further embodiment, rough gold spheres of 10 micrometers in diameter were applied without "Sauereisen" cement to the crystal surfaces as the anode contact. Appreciable quantities of light were observed to emanate from the vicinity of the gold contacts.

Indicator lights, symbolic and graphic displays are prime examples of used for these novel LED's.

The high photon energy of the light emitted by the diodes of this invention also opens up film annotation-recording uses wherein light sensitive film can be directly exposed at rapid speed, without requiring spectral sensitization of the film. In a similar manner, selective energization of a coded array of diodes will enable facsimile recording.

The ease with which light of any color can be produced by coupling the diodes with appropriate phosphors, enables the production of display devices in any color and, more importantly, the production of multicolor displays in a color coded array analogous to conventional color television screens.

The wavelength of the emitted light matches the peak sensitivity of many photodetectors, and enables the use of the diodes of the present invention as optoisolator systems even under ambient light conditions.

The diodes are further useful in gas spectrographic detection systems in which selective absorption of the light provides an indication of the composition and presence of a particular gas.

The energetic radiation is also useful in initiating catalytic behavior in chemical reactions to provide selective reactions at only localized locations.

The ease with which multiple colors may be produced allows many advantages when used as instrument panel lamps, indicator lamps in automobiles, airplanes, etc., alphameric character displays, flat screen displays and the like.

These diodes exhibit response times in the submicrosecond range. This allows the diodes to be used in information data links such as computer data transmission lines and the like.

Having thus described the present invention, what we claim is:

1. A light emitting diode comprising a crystal of high efficiency violet fluorescing zinc oxide, a substantially ohmic cathode secured to a portion of the crystal and a rectifying anode secured to another portion of the crystal, which diode emits light at room temperature when a low electrical potential is applied across said cathode and anode, wherein the zinc oxide crystal is a thin z-cut slab sectioned from a single crystalline boule and wherein the rectifying anode is secured to an oxygen face of said slab.

2. A diode according to claim 1, wherein the zinc oxide crystal is characterized by fluorescent efficiency at 77° K of not less than 0.001 and a carrier concentration of not less than $10^{17}$ electrons per $cm^3$.

3. A diode according to claim 1, wherein the substantially ohmic cathode comprises a material having a work function not appreciably greater than the work function of zinc oxide.

4. A diode according to claim 3, wherein said cathode material consists of indium or zinc.

5. A diode according to claim 3, wherein said cathode material consists of transparent conductive oxides of tin, indium or mixtures thereof.

6. A diode according to claim 1, wherein said rectifying anode comprises gold, platinum, carbon, silver or copper.

7. A diode according to claim 1, wherein the rectifying anode contains at least one point contact.

8. A diode according to claim 7, wherein the point contacts comprise a conductive paint secured to a crystal surface substantially free of destruction layers, which paint comprises gold particles dispersed in a silicate binder.

9. A diode according to claim 1, further comprising a layer of luminescent material secured to receive light emitted from the zinc oxide crystal and to emit light of a second wavelength in response to said received zinc oxide emitted light.

10. A diode according to claim 1, wherein the zinc oxide crystal has opposing major faces and the cathode and anode comprise layers evaporated onto said faces.

11. A diode according to claim 10, further comprising electrical contacts and means for holding the electrical contacts under pressure against the evaporated layers to facilitate passage of electrical current.

12. A diode according to claim 1, wherein each cathode and anode is a conductive paint, foil or evaporated film.

13. A diode according to claim 1, in which said crystal consists of a pure crystal of high efficiency violet fluorescing zinc oxide.

14. A diode according to claim 1, in which said crystal consists of an untreated crystal of high efficiency violet fluorescing zinc oxide.

15. A diode according to claim 1, wherein said crystal is further fabricated to have a pair of optically parallel and at least partially reflective faces to form a resonant cavity for the production of coherent emission.

16. A light emitting diode according to claim 1, wherein the rectifying anode comprises an array of isolated anodes on a surface of the zinc oxide crystal and the substantially ohmic cathode is secured to a portion of the crystal selected so as not to impede the emission of light from the vicinity of each of said array of isolated anodes.

17. A diode according to claim 7, wherein the point contact has an active barrier area having an average diameter of not more than 0.5 micrometers.

18. A diode according to claim 7, wherein a number of point contacts are contained within the rectifying anode.

* * * * *